United States Patent [19]

Crain et al.

[11] Patent Number: 4,517,448
[45] Date of Patent: May 14, 1985

[54] INFRARED FURNACE WITH ATMOSPHERE CONTROL CAPABILITY

[75] Inventors: N. Robert Crain, Huntington Beach; Carson T. Richert, Buena Park, both of Calif.

[73] Assignee: Radiant Technology Corporation, Cerritos, Calif.

[21] Appl. No.: 319,096

[22] Filed: Nov. 6, 1981

Related U.S. Application Data

[63] Continuation-in-part of Ser. No. 119,496, Feb. 7, 1980, abandoned, and Ser. No. 306,200, Sep. 28, 1981, abandoned.

[51] Int. Cl.³ .......................... F27B 9/04; F27D 7/02
[52] U.S. Cl. .................................. 219/388; 219/411; 219/390; 432/64; 432/144
[58] Field of Search ............... 219/388, 354, 405, 411, 219/343, 390, 342; 432/64, 65, 137, 144; 34/216; 99/386

[56] References Cited

U.S. PATENT DOCUMENTS

| | | | |
|---|---|---|---|
| 2,056,207 | 10/1936 | Piazzoli | 219/388 |
| 2,334,865 | 11/1943 | Crawford | 165/65 |
| 2,674,809 | 4/1954 | Meienhofer | 219/388 |
| 2,981,819 | 4/1961 | Gregory | 219/35 |
| 3,415,503 | 12/1968 | Beck | 263/8 |
| 3,436,524 | 4/1969 | Pauls | 219/347 |
| 3,515,854 | 6/1970 | Williams | 219/388 |
| 3,818,181 | 6/1974 | Benard | 219/388 |
| 3,836,751 | 9/1974 | Anderson | 219/411 |
| 4,101,759 | 7/1978 | Anthony et al. | 219/343 |
| 4,244,285 | 1/1981 | Baker | 219/388 |
| 4,245,613 | 1/1981 | Wells | 219/388 |
| 4,389,562 | 6/1983 | Chaudoir | 219/388 |

Primary Examiner—Roy N. Envall, Jr.
Assistant Examiner—Teresa J. Walberg
Attorney, Agent, or Firm—Christie, Parker & Hale

[57] ABSTRACT

An infrared furnace has a housing with insulated walls defining an elongated straight tunnel disposed on a longitudinal axis between an entrance and an exit. A conveyor continuously moves through the tunnel along the longitudinal axis between the entrance and the exit. A first plurality of elongated tubular infrared heating elements are disposed in the tunnel above the conveyor in spaced apart parallel relationship transverse to the longitudinal axis. A second plurality of tubular elongated infrared heating elements are disposed in the tunnel below the conveyor in spaced apart parallel relationship transverse to the longitudinal axis. The housing has insulated walls each comprising a porous insulative inner panel and a non-porous outer panel. At least one of the outer panels is spaced from its associated inner panel to form a plenum chamber therebetween. The insulated walls define an elongated tunnel in which a source of infrared radiation is disposed. Gas under pressure is supplied to the plenum chamber to induce flow through the inner panel to the tunnel. A first baffle unit has a chamber connecting the entrance of the tunnel to the exterior of the furnace. A second baffle unit has a chamber connecting the exit of the tunnel to the exterior of the furnace such that the conveyor passes through the chambers. Gas is injected onto the conveyor in the chambers to prevent contamination from entering the tunnel. A plurality of parallel spaced apart rods extend through the tunnel parallel to its longitudinal axis directly under the conveyor to support the conveyor. Two of the rods lie near the respective sides of the housing and heating elements are disposed in these rods to compensate for heat loss to the sides of the housing.

45 Claims, 20 Drawing Figures

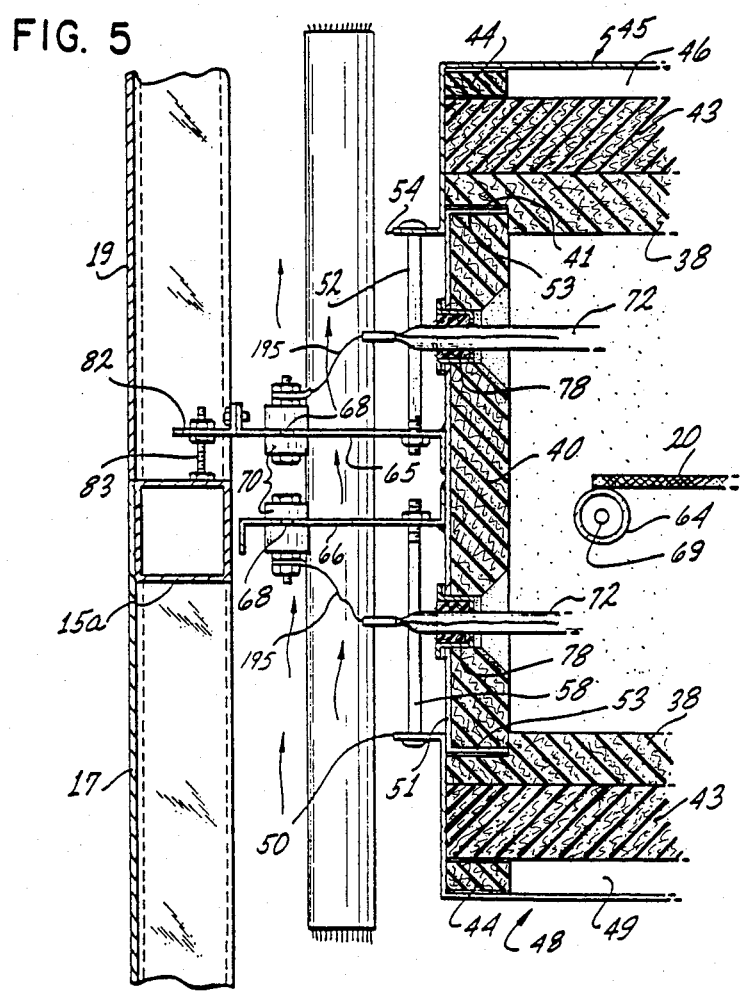

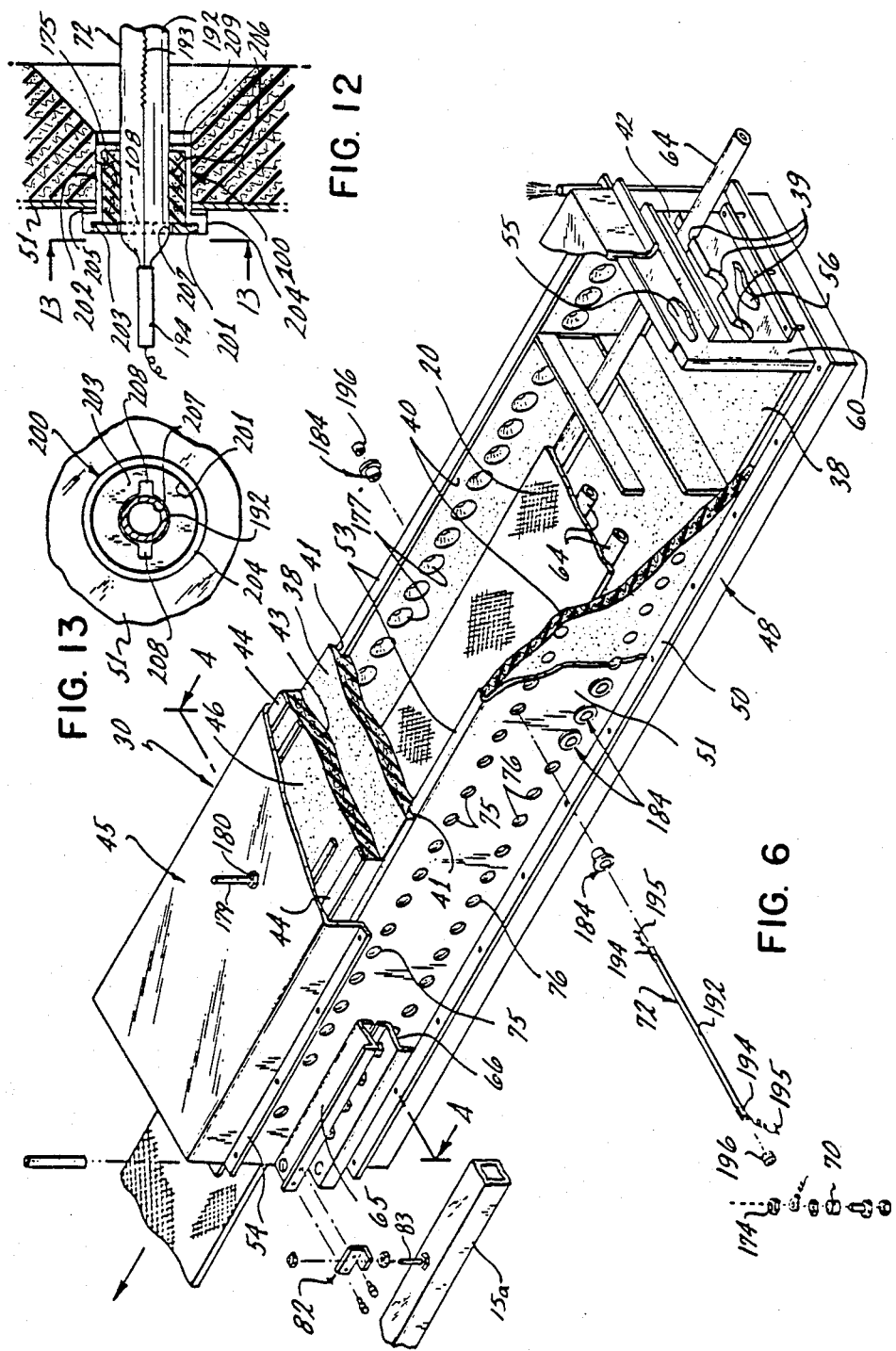

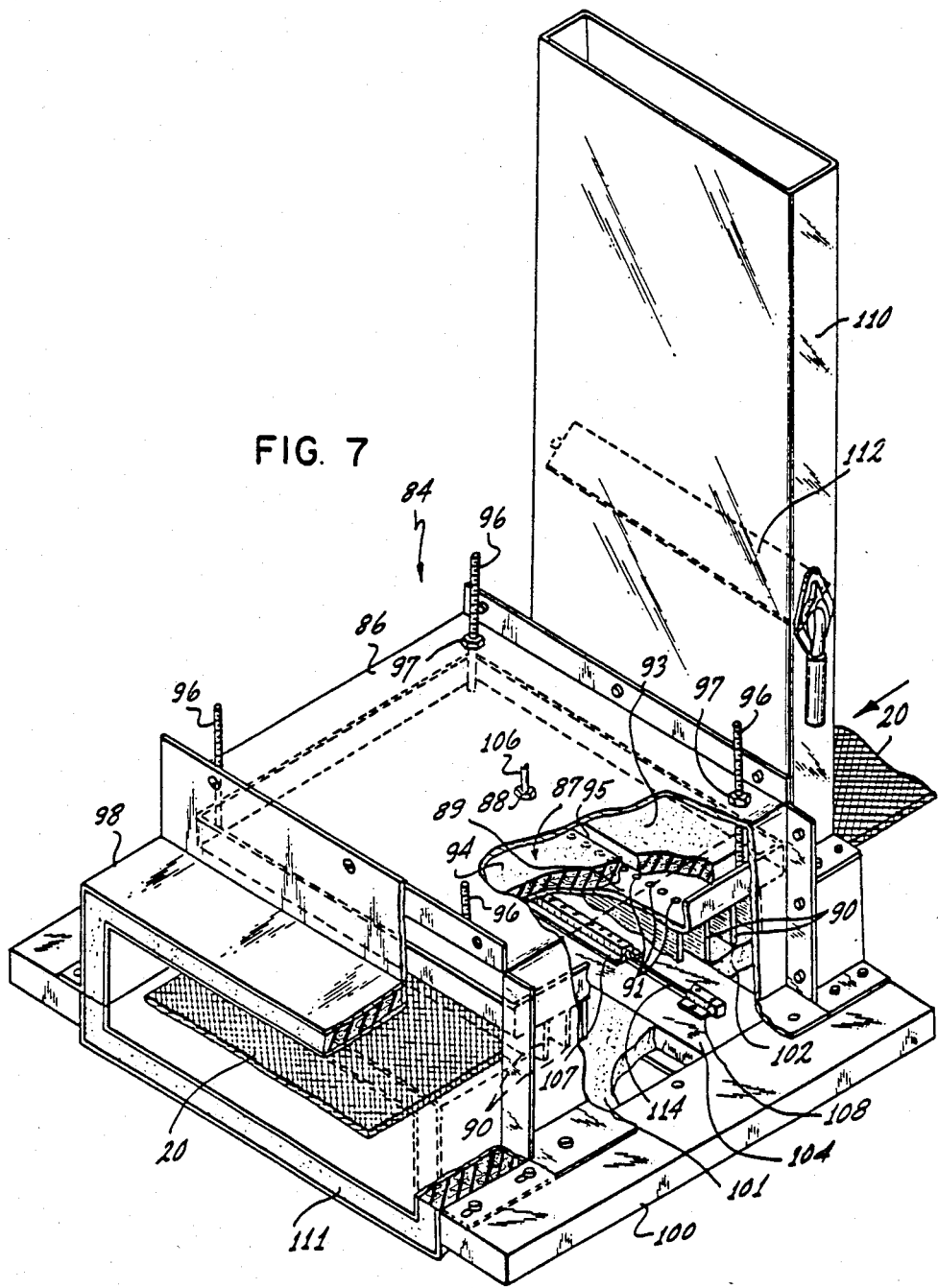

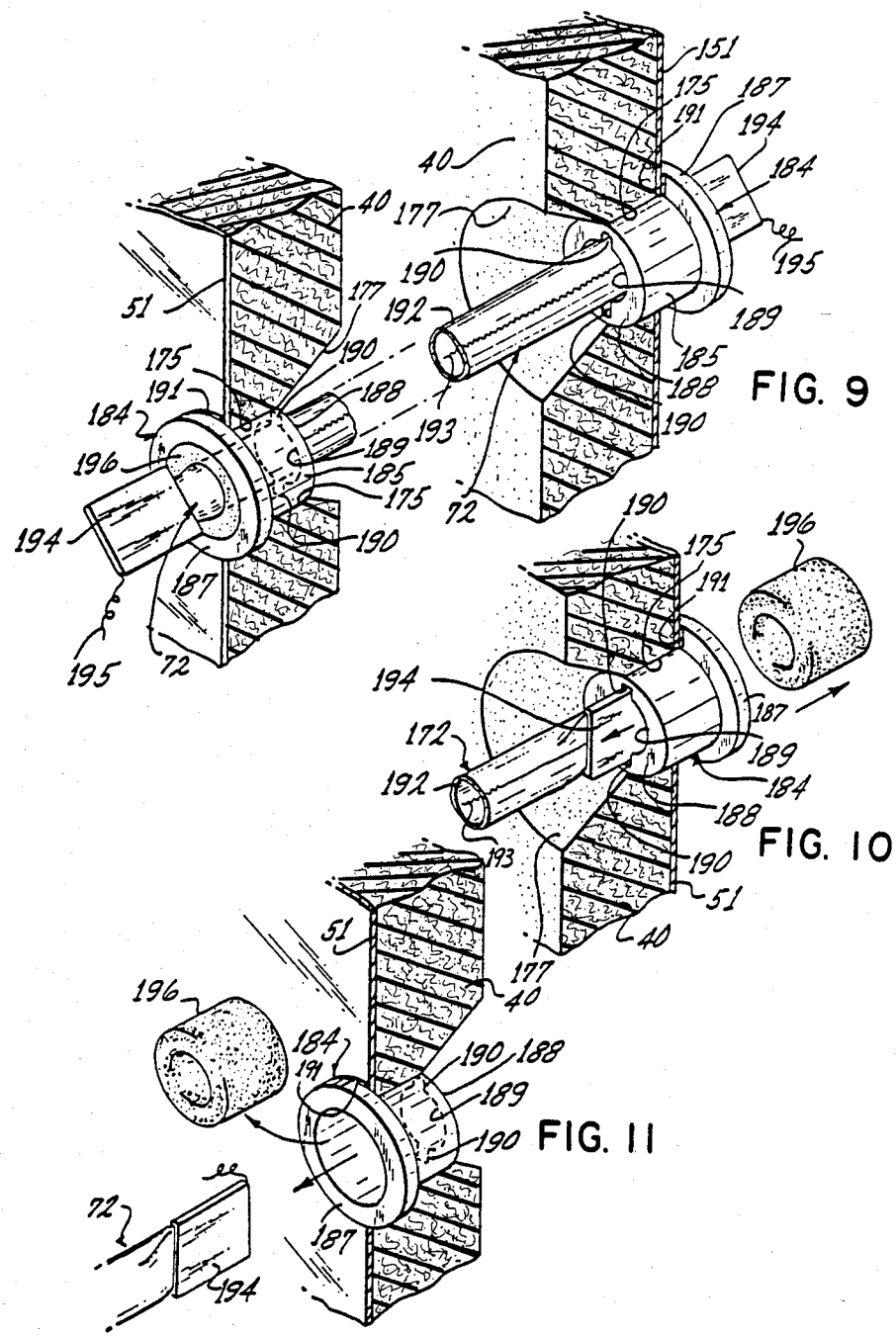

INFRARED FURNACE WITH ATMOSPHERE CONTROL CAPABILITY

CROSS REFERENCE TO RELATED APPLICATIONS

This application is a continuation-in-part of Ser. No. 119,496, now abandoned, filed Feb. 7, 1980, and Ser. No. 306,200, filed Sept. 28, 1981, now abandoned, the disclosures of which are incorporated herein by reference.

BACKGROUND OF THE INVENTION

This invention relates to heating apparatus and more particularly to a furnace especially in a controlled atmosphere adapted for high speed, high volume continuous processing of workpieces.

An infrared furnace provided with an endless conveyor belt is highly useful since infrared heating elements located in different zones along the length of the heating chamber of the furnace can be quickly heated up as needed to give a desired temperature profile in the direction of travel of the conveyor belt.

In an infrared furnace, the level of the internal ambient temperature that can be attained within its heating chamber is limited by the maximum allowable temperature of the infrared source. This internal ambient temperature is determined by the temperature of the interior walls of the heating chamber and any objects enclosed therein which heat up by absorbing the radiation emitted by the infrared heating elements.

Prior art attempts to maintain the ambient temperature in the heating chamber of an infrared furnace at a safe level include providing for cooling the metal walls of the heating chamber; providing metal reflectors adjacent the metal walls of the heating chamber for reflecting the radiation from the infrared heating elements back onto the workpieces being carried on the moving conveyor belt; and providing for cooling each of the infrared heating elements by enclosing its envelope within a cooling tube which is transparent to the infrared radiation.

SUMMARY OF THE INVENTION

According to one aspect of the invention, an infrared furnace has a housing with insulated walls defining an elongated straight tunnel disposed on a longitudinal axis between an entrance and an exit. The insulated walls comprise sheets of insulation in the form of compressed, white alumina fiber enclosed in a sheet metal housing. A conveyor continuously moves through the tunnel along the longitudinal axis between the entrance and the exit. A first plurality of elongated tubular infrared heating elements are disposed in the tunnel above the conveyor in spaced apart parallel relationship transverse to the longitudinal axis. A second plurality of tubular elongated infrared heating elements are disposed in the tunnel below the conveyor in spaced apart parallel relationship transverse to the longitudinal axis. The described furnace provides uniform controlled heating of workpieces placed on the conveyor. The workpieces are continuously exposed to direct and indirect radiation from the sources during their residence in the furnace.

Another aspect of the invention is an infrared furnace having a housing with insulated walls each comprising a porous insulative inner panel and a nonporous outer panel. At least one of the outer panels is spaced from its associated inner panel to form a plenum chamber therebetween. The insulated walls define an elongated tunnel in which a source of infrared radiation is disposed. Gas under pressure is supplied to the plenum chamber to induce flow through the inner panel to the tunnel, thereby controlling the atmosphere where workpieces are exposed to radiation from the source.

Another aspect of the invention is an infrared furnace employing baffle units. A housing has insulated walls defining an elongated tunnel between an entrance and an exit. A conveyor continuously moves through the tunnel between the entrance and the exit. A baffle unit has a chamber connecting the entrance of the tunnel to the exterior of the furnace. A second baffle unit has a chamber connecting the exit of the tunnel to the exterior of the furnace such that the conveyor passes through the chambers. Gas is injected onto the conveyor in the chambers to prevent contamination from entering the tunnel.

Another aspect of the invention is the use of a plurality of conveyor support rods in an infrared furnace. The furnace has insulated walls defining an elongated tunnel disposed on a longitudinal axis between an entrance and an exit. A conveyor continuously moves through the tunnel along the longitudinal axis between the entrance and the exit. A source of infrared radiation is disposed in the tunnel. A plurality of parallel spaced apart rods extend through the tunnel parallel to its longitudinal axis directly under the conveyor to support the conveyor. Preferably, two of the rods lie near the respective sides of the housing and heating elements are disposed in these rods to compensate for heat loss to the sides of the housing.

BRIEF DESCRIPTION OF THE DRAWINGS

The features of a specific embodiment of the best mode contemplated of carrying out the invention are illustrated in the drawings, in which:

FIG. 5 is an enlarged transverse-sectional view showing a portion of the heating chamber with the front panels mounted on the supporting framework therefor;

FIG. 6 is an overall perspective view of the heating chamber;

FIG. 7 is a perspective view of the baffle unit on the entrance end of the heating chamber;

FIG. 9 is a perspective view showing the end portions of an infrared lamp mounted in the ceramic holders secured on each of the side walls of the heating chamber;

FIG. 10 shows the metal terminal on the right end portion of an infrared lamp being moved through the ceramic holder secured on the right side wall of the heating chamber;

FIG. 11 shows the metal terminal on the right end portion of the infrared lamp being moved out of the ceramic holder secured on the left side wall of the heating chamber;

FIG. 12 is an enlarged cross-sectional view showing the end portion of an infrared lamp mounted in an alternate embodiment of the ceramic holder secured in the side wall of the heating chamber;

FIG. 13 is an end view of the ceramic holder taken along the line 13—13 of FIG. 12;

DETAILED DESCRIPTION OF THE SPECIFIC EMBODIMENTS

Figure 1:
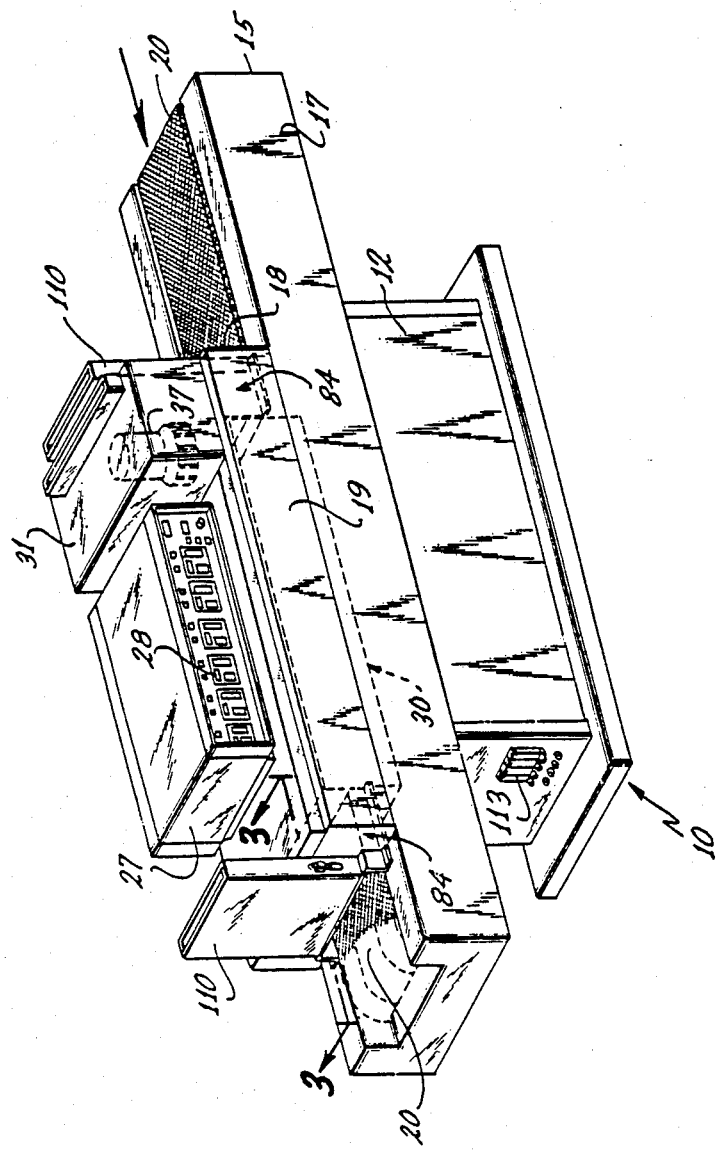
FIG. 1 is an overall front perspective view of an infrared furnace incorporating principles of the present invention.
Figure 2:
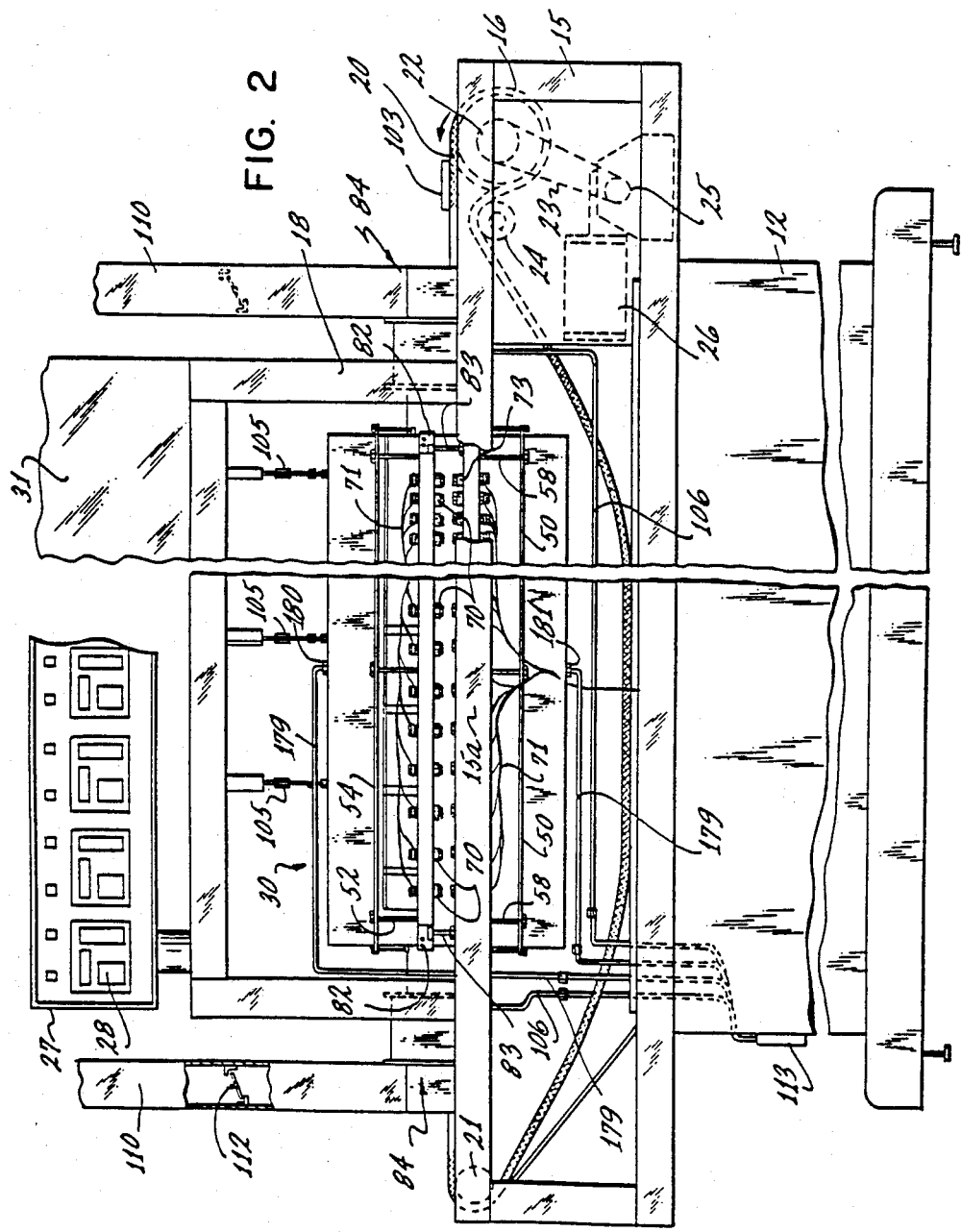
FIG. 2 is a front view of the infrared furnace shown in FIG. 1 with the front panels removed to show the heating chamber therein.

Referring to FIG. 2 of the drawings, the infrared furnace 10 of the present invention includes a pedestal 12 having mounted thereon a rectangular lower framework 15. The enclosure for the lower framework is provided with a removable front panel 17. Mounted on the top of the rectangular framework 15 inwardly from the ends thereof is a shorter, rectangular upper framework 18. The enclosure for the upper framework 18 is provided with a removable front panel 19. A heating chamber 30 is supported within the lower and upper frameworks 15 and 18. Mounted on the top of the upper framework 18 is a compartment 27 having on the front thereof a panel 28 which provides electronic controls for controlling the temperature in different zones along the length of the heating chamber 30. Mounted in a compartment 31 on the side of the compartment 27 is an electric fan 37 for drawing cooling air entering an opening (not shown) in the back of the pedestal 12 past the electronic power circuits enclosed therein and up past the sides of the heating chamber 30.

Reference will next be made to FIG. 2 which shows a front view of the infrared furnace 10 with the front panels 17 and 19 removed from the respective lower and upper frameworks 15 and 18. As shown, the elongated rectangularly shaped heating chamber 30 is supported as a unit at its four corners by support lugs 82 attached by bolts 83 to the upper longitudinal side members 15a of the lower framework 15 (FIG. 5). Mounted on the end of the lower framework 15 adjacent the entrance end of the heating chamber 30 is a drive roller 16 and mounted on the other end of the lower framework adjacent the exit end of the heating chamber 30 is a smaller roller 21. An endless conveyor belt 20 engages about the peripheral surfaces of the rollers 16 and 21. An adjustable roller 24 associated with the drive roller 16 provides for controlling the tension on the upper portion of the conveyor belt 20 spanning the rollers 16 and 21. The drive roller 16 is provided with a gear 22 on its hub which is attached by a chain drive 23 to a lower geat 25 supported on the lower framework 15. An electronic motor 26 has its shaft coupled to drive the lower gear 25.

It is thus seen that the endless conveyor belt 20, which is of the open mesh type and preferably formed of stainless steel, horizontally passes through the heating chamber 30 which is mounted between the spaced top longitudinal side members 15a of the lower framework 15.

Figure 4:
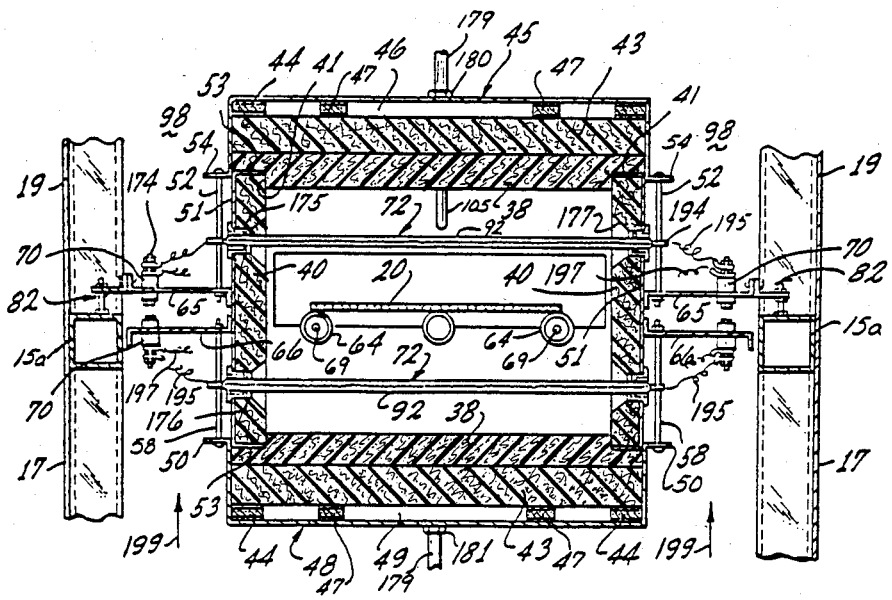
FIG. 4 is a transverse-sectional view of the heating chamber as taken on line 4—4 of FIG. 3.

Reference will next be made to an overall perspective view of the heating chamber 30 as illustrated in FIG. 6 and a cross-sectional view thereof as illustrated in FIG. 4. The heating chamber 30 is an elongated rectangularly shaped enclosure having its upper and lower walls constructed of sheets 38 of insulation, and having its side walls constructed of sheets 40 of insulation. The sheets 38 and 40 of insulation are formed by compressing a heat insulating material such as a white alumina fiber so that it forms a porous structural wall having a relatively smooth surface. The alumina fiber of which the sheets 38 and 40 are formed has a 3000° F. rating. To facilitate the interfitting of the side sheets 40, the inner side edges of the upper and lower sheets 38 are provided with right angled notches 41. Provided on the upper and lower walls of the heating chamber formed by the sheets 38 of insulation are outer sheets 43 of insulation. These outer sheets 43 of insulation are similarly formed of a compressed heat insulating material such as an alumina fiber which is characterized by being porous and has a 2000° F. rating. Strips 44 of similar insulation are secured along the four edges of the top and bottom outer sheets 43 of insulation. Additionally, several longitudinally extending short strips 47 of similar insulation material are secured in spaced relationship on the top and bottom outer sheets 43.

A sheet metal side wall 51 covers each of the side sheets 40 of insulation and is provided with flanges 53 on the top and bottom thereof which fit in the right angled notches 41 provided on the inner side edges of the upper and lower sheets 38 of insulation.

Figure 3:
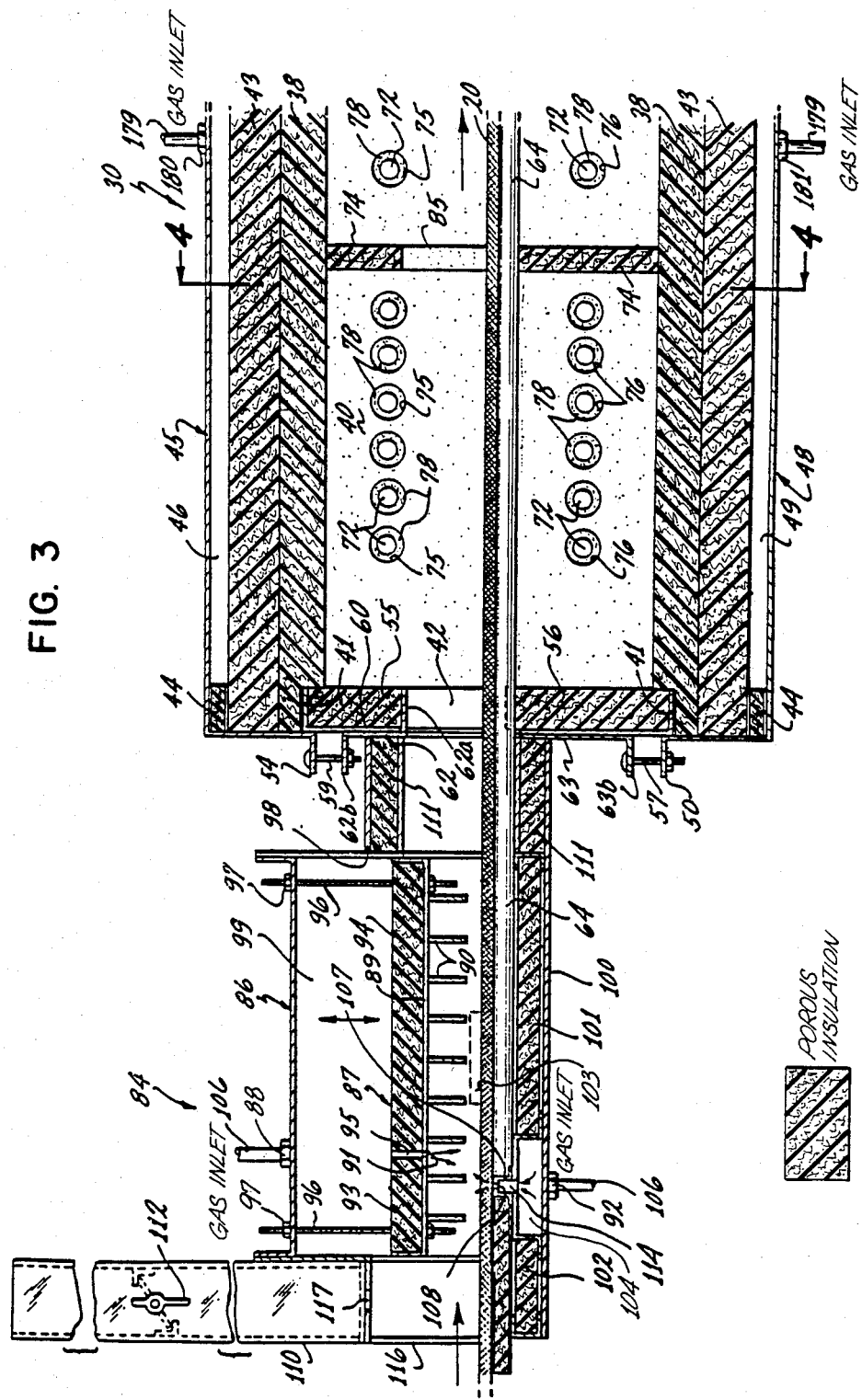
FIG. 3 is a sectional view of the baffle unit on the entrance end portion of the heating chamber as taken on line 3—3 of FIG. 1.

As shown in FIG. 4, which is a transverse section through the heating chamber as taken along line 4—4 of FIG. 3, upper and lower horizontally disposed metal tray members 65 and 66 are provided on each side of the heating chamber 30. Each tray member extends the full length of the heating chamber 30 and is spot welded to the sheet metal side walls 51 thereof.

As best illustrated in FIG. 6, the end wall at each end of the heating chamber 30 comprises an upper insulation sheet member 55 and a lower insulation sheet member 56 which are vertically spaced to provide a rectangular port or opening 42 through which the conveyor belt 20 passes. The lower insulation member 55 is provided on the upper edge thereof with three spaced semi-circular grooves 39. A sheet metal end wall 60 having a rectangular opening therein conforming with the opening 42 covers the two insulation members 55 and 56. A sheet metal upper bracket 62 provided with an outer flange 62b on the top thereof and an inner flange 62a on the bottom thereof is positioned with its inner flanges 62a engaging the top edge of the opening 42. Likewise, a sheet metal lower bracket 63 provided with an outer flange 63b on the bottom thereof with cutouts corresponding to grooves 39 and an inner flange 63a on the top thereof is positioned with its inner flange 63a engaging the bottom edge of the opening 42.

A sheet metal top casing or cover 45 provided with flanges 54 is fitted down over the upper end portion of heating chamber 30 with its top inner wall contacting the edge strips 44 of insulation thereby forming an upper plenum chamber 46. Likewise, a sheet metal bottom casing or cover 48 provided with flanges 50 is fitted up over the lower end portion of the heating chamber 30 with its bottom inner wall contacting the edge strips 44 of insulation thereby forming a lower plenum chamber 49.

As shown in FIG. 4, to hold the insulating walls of the heating chamber 30 in assembled position, the sides of the top cover 45 of the heating chamber are drawn down over the side walls 51 and held by tie rods 52 passing through openings in the side flanges 54 of the top cover 45 and aligned openings in the walls of the upper metal tray member 65. Likewise, the sides of the bottom cover 48 of the heating chamber 30 are drawn up over the side walls 51 and held by tie rods 58 passing through openings in the side flanges 50 of the bottom cover 48 and aligned openings in the walls of the lower metal tray members 66. The ends of the top cover 45 are drawn down and held by tie rods 59 (FIG. 3) passing through openings on the end flanges 54 on the top cover 45 and aligned openings on the flanges 62b on upper brackets 62. Likewise, the ends of the bottom cover 48 are drawn up and held by tie rods 57 passing through openings on the end flanges 50 on the bottom cover 48 and aligned openings on the flanges 63b on lower brackets 63.

The endless conveyor belt 20 is supported to ride within the heating chamber 30 on three quartz tubes 64 which extend throughout the length of the heating chamber 30 and rest on the three semi-circular grooves 39 provided on the lower insulation members 56 of the end walls.

Each of the side walls of the heating chamber is provided with an upper series of spaced circular holes 75 above the conveyor belt 20 and a lower series of spaced circular holes 76 below the conveyor belt 20. Each of the circular holes 75 and 76 extends through the sheet metal side covers 51 and the sheet 40 of insulation forming each of the side walls. The inner half portions of each of the holes 75 and 76 in the sheet 40 of insulation is provided with a forty-five degree chamfer 177.

A mounting device in the form of a ceramic holder 184 is positioned in each of the circular holes 75 and 76. Each ceramic holder has a hollow cylindrical body 185 with a shoulder 187 on the outer end thereof and a bottom wall 188 on the inner end thereof. The bottom wall 188 is provided with a concentric circular opening 189 and a pair of diametrically disposed keyways or notches 190. The length of the body 185 of the ceramic holder 184 is approximately one-half the thickness of the side sheets 40 of insulation.

Each ceramic holder 184 is positioned with its cylindrical body 185 having a relatively close fit in one of the circular holes 75 or 76 on the side walls and with the shoulder 187 thereof lying against the sheet metal side wall 51 and permanently sealed in position by use of a silicone sealant 191.

Figure 8:
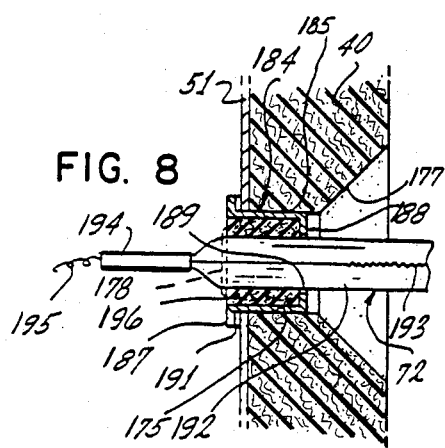
FIG. 8 is an enlarged cross-sectional view showing the end portion of an infrared lamp mounted in the ceramic holder secured in the side wall of the heating chamber.
Figure 20:
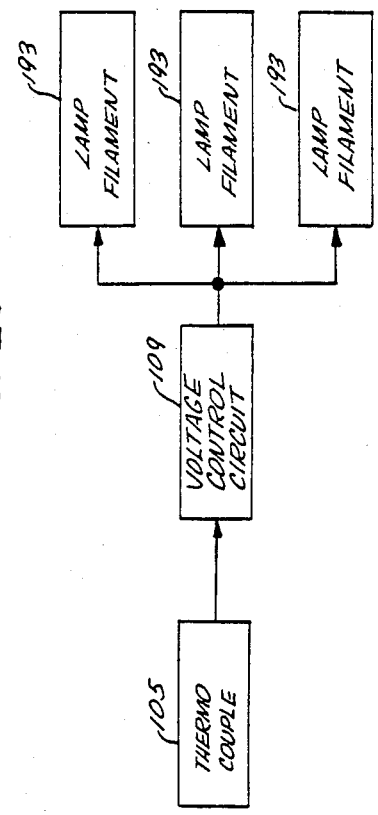
FIG. 20 is a schematic block diagram of the apparatus for controlling the operating temperature in the described IR furnace.
Figure 14:
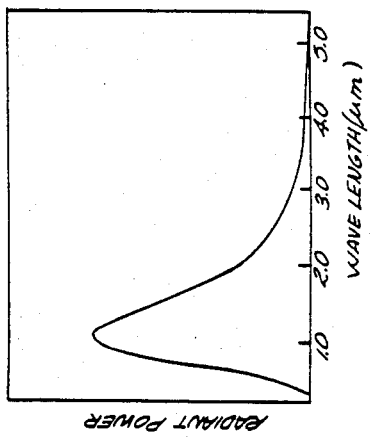
FIG. 14 is a diagram showing the power spectrum of an infrared radiation source of the type utilized in practicing the invention.
Figure 19:
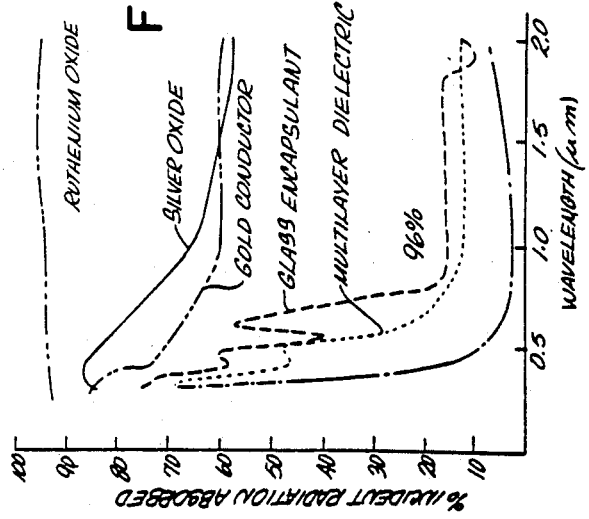
FIG. 19 is a graph depicting the differences in near infrared absorption of different thick film materials as a function of wavelength.

A plurality of elongated infrared lamps 72 are mounted with their end portions passing through the respective circular openings 189 in opposing ceramic holders 184 secured on the side walls of the heating chamber 30. Lamps 72 are thus arranged side by side transverse to the direction of movement of conveyor belt 20 above and below conveyor belt 20. Each infrared lamp 72 comprises a transparent or translucent elongated quartz tube 192 in the center of which is located an electrically heated infrared ray emitting filament 193 which is preferably made of tungsten. A specifically illustrated in FIGS. 8 and 12, tube 192 is hermetically sealed at its ends. The ends of the quartz tube 192 are provided with generally rectangularly shaped flat metal terminals 194 which connect to the respective ends of the tungsten filament 193. The metal terminals are a little wider than the diameter of the quartz tube 192 of the infrared lamp 72. Leads 195 are connected to each metal terminal 194. The described infrared lamps are well known, commercially available products, the tubes thereof generally being charged with an inert gas such as Argon. FIG. 14 shows a typical power spectrum for such an infrared source. As depicted, the power is concentrated in the near infrared band extending approximately from 0.7 microns to approximately 2.5 microns. The exact distribution and the wavelength of the peak power vary as a function of the temperature of the lamp filament. Generaly, sufficient electrical voltage is supplied to the lamp filament to maintain a filament temperature typically in the range of 1400° to 2000° K., depending upon the desired operating temperature and the quantity of heat that needs to be transferred to the thick film circuits, which in turn depends upon the transport speed.

To mount an infrared lamp 72 in a pair of the ceramic holders 184 provided in the upper holes 75 on the side walls of the heating chamber 30, the metal terminal 194 on one end of the infrared lamp 72 is inserted into the ceramic holder 184 secured in hole 75 on one of the side walls. The infrared lamp 72 is then rotated, as needed, such that its metal terminal 194 passes through the notches 190 on the bottom wall 188 of the ceramic holder. The quartz tube 192 of the infrared lamp 72 is then pushed through the circular opening 189 in the bottom wall 188 of the ceramic holder 184 until the metal terminal 194 reaches the opposing hole 75 in the opposite side wall. The chamfer 177 on the inner portion of the hole 75 aids in guiding the metal terminal 94 into the hole. Rotation of the infrared lamp then enables the metal terminal 194 to slide through the notches 190 in the bottom wall 188 of the ceramic holder 184 on this opposite side wall such that the end portions of the infrared lamp 72 protrude outwardly from each of the ceramic holders 184. A gasket 196 formed of resilient refractory material, such as alumina fiber, and in the shape of a short tube, is then fitted over the metal terminal 194 on each end of the infrared lamp 72 and packed tightly within the ceramic holder 184. It may be desirable in some cases to apply a silicone sealant 170 on the outer end of the cylindrical opening of the ceramic holder 184 to provide further sealing.

It may be desirable in other cases to saturate the short tube-like alumina gasket 196 in a solution of soluble refractory material such as sodium silicate just prior to inserting it over the metal terminal 194 on the end of the infrared lamp 172 and packing it into the cavity of the ceramic holder 184 around the quartz tube 192. Upon drying, the alumina gasket 196 is effectively bonded to the wall of the ceramic holder 184 and the wall of the quartz tube 192 of the infrared lamp 72. This assures that the alumina gasket 196 does not work loose in the ceramic holder 184 as a result of the expansion and contraction of the side walls of the heating chamber 30 and that the joint will remain gas tight.

It should now be clearly understood that an infrared lamp 72 is thus transversely disposed in each of the opposing pairs of upper and lower holes 75 and 76 in the side walls of heating chamber 30 with its flat metal terminals 194 protruding outside each of the sheet metal side walls 51.

As shown in FIG. 4, the upper and lower tray members 65 and 66 attached on the side walls of the heating chamber 30 each have a series of spaced ceramic posts 70 mounted along the length thereof corresponding to the upper and lower series of spaced holes 75 and 76 in the side walls of the heating chamber 30. The metal contacts 174 on the ends of the ceramic posts 70 have connected thereto the ends of the leads 195 on the metal terminals 194 of the associated infrared lamp 72. Each metal contact 174 on the ceramic post 70 is connected, in turn, by a lead 197 to the power circuits within the pedestal 12 and the control panel 28. These leads 197 are bundled together and passed through vertical tubular guides 79 held in openings on the longitudinal ends of the upper and lower metal trays 65 and 66 (FIG. 5).

A cover gas which may be nitrogen or oxygen, for exmaple, may be fed under a low pressure by way of tubes 179 to connectors 180 and 181 on the respective top and bottom plenum chambers 46 and 49 on the heating chamber 30, as illustrated in FIGS. 4 and 6. The cover gas slowly and evenly filters through the porous sheets 42 and 38 of insulation which form each of the top and bottom walls of the heating chamber 30 thus causing the interior of the heating chamber to be at a slightly higher pressure than the atmosphere surrounding the infrared furnace. It is for this reason that the ceramic holder 184 is provided with a silicone sealant 191 on its shoulder 187 to prevent cover gas in the heating chamber 30 from escaping at these points and the alumina gasket 196 is provided within each of the ceramic holders 184 to seal off the openings 189 in the bottom walls 188 thereof through which the end portions of the quartz tube 192 of the infrared lamp 72 pass.

As illustrated in FIG. 4, the upper and lower metal tray members 65 and 66 provide for holding the leads 195 and 197 spaced away from the side walls of the heating chamber 30. Thus, with the front and back upper and lower panels 17 and 19 in position on the respective lower and upper frameworks 15 and 18, vertical passageways 98 are formed on the longitudinal sides of the heating chamber 30 through which fan 37 can draw cooling air, as indicated by arrows 199, to cool the leads 195 and 197 and the metal terminals 194 of the infrared lamps 72.

It should be noted that, if were it not for the silicone sealant 191 on the shoulders 187 of the ceramic holders 184 and the alumina gaskets 196 on the end portions of the lamp 72, the cooling air moving past the protruding end portions of the infrared lamp 72 could possibly seep through holes 75 or 76 on the side walls, contaminating the atmosphere within the heating chamber.

It should be especially noted that the bottom wall 188 of the ceramic holder 184 provides for retaining the alumina gasket 196 so that it will not be accidentally pushed into the interior of the heating chamber 30 when the infrared lamp 72 is being inserted or removed from its mounting in the side walls of the heating chamber 30.

When an infrared lamp 72 burns out and is to be replaced, the leads 195 connected to the metal terminals 194 on each end thereof are disconnected from the metal contacts 174 on the ends of the ceramic posts 70 provided on the tray members 65 or 66. As illustrated in FIG. 10, the resilient alumina gaskets 196 are then removed from the ceramic holders 184 on each of the side walls of the heating chamber 30. The infrared lamp 72 is then rotated, as needed, by use of the protruding opposite left end thereof such that the right metal terminal 194 can slide through the notches 190 on the bottom wall 188 of the ceramic holder 184 on the right side wall. Continued pulling of the left end of the infrared lamp 72 then causes the metal terminal 194 of the right end thereof to pass through the notches 190 of the ceramic holder 184 on the left side wall, as illustrated in FIG. 11.

It should be now clear that each infrared lamp 72 in the heating chamber 30 is readily individually serviceable and replaceable without the disconnection of or disturbance of any of the other lamps. Furthermore, the close fit of the ceramic holders 184 in the holes 75 and 76 in the side walls of the heating chamber 30 and the securing of the shoulders 187 thereof on the sheet metal covers 51 not only give support to the ceramic holders 184 but provide for a precise replacement of the infrared lamps 72 in the heating chamber 30. Moreover, the ceramic holders 184 serve as a barrier to protect the metal terminals 194 from the heat of the heating chamber.

An alternative embodiment of a ceramic holder 200 is shown in FIGS. 12 and 13. The ceramic holder 200 is shaped similarly to the ceramic holder 184 shown in FIG. 8 with the exception that the holder 200 is provided with an internal concentric recess 201 on the outer end of the cylindrical body 202 thereof. Each of the ceramic holders 200 is inserted in a hole 75 or 76 in the side wall of the heating chamber 30 with its shoulder 204 cemented by a silicone sealant 205 to the sheet metal side cover 51 of the heating chamber 30. An infrared lamp 72 is then inserted such that its end portions extend through respective opposing ceramic holders 200. A gasket 206 of alumina fiber is then fitted over each of the end metal terminals 194 of the infrared lamp 72 and tightly packed into the cavity of the ceramic holder 200 around the quartz tube 192. A circular ceramic end cover 203 having a concentric opening 207 with diametrically opposing keyways or notches 208 (see FIG. 13) thereon is then positioned over the metal terminal 194 of the infrared lamp 72 with its concentric opening 207 fitted closely about the quartz tube 192 of the infrared lamp 72. The ceramic end cover 203 has its inner surface wetted with a sodium silicate solution which upon drying provides for effectively cementing the end cover 203 within the internal circular recess 201 of the ceramic holder 200. Note that the end cover 203 serves to retain the alumina gasket 206 tightly packed within the cavity of the ceramic holder 200 and, together with the bottom wall 209, prevents the gasket 206 from working loose with the contraction and expansion of the side walls resulting from the heating and cooling of the chamber 30.

The entrance portion of the heating chamber 30 is separated from the remaining portion thereof by a vertical wall formed of upper and lower sheet members 74 (FIG. 13) of high temperature insulation spaced to provide a central rectangular opening 85 for the traveling endless conveyor belt 20. As shown in FIG. 6, the series of upper and lower holes 75 and 76 for receiving the transversely disposed infrared lamps 72 are more closely spaced in the entrance portion of the heating chamber 30 than in the remaining portion thereof. Such an arrangement provides for initially quickly heating up to a desired temperature the workpieces 103 (FIG. 2) placed on the conveyor belt 20 at the entrance end of the heating chamber 30.

As indicated in FIG. 2, the heating chamber 30 can be made as long as desired. Groups of successive infrared lamps 72 inserted in the upper and lower holes 75 and 76 thereof (FIG. 6) are then coupled together to form as many longitudinal zones as desired having separate control circuits to provide a desired thermal gradient or profile along the path of the conveyor belt 20. The near infrared radiation from lamps 72 is directly dependent on the voltage amplitude supplied to the lamp filaments. Temperature probes 105 each include a thermocouple with one junction lying in chamber 30 between top sheet 38 and lamps 72 (FIG. 4). As shown in FIG. 21, each temperature probe 105 is coupled to a voltage control circuit 109 which in turn supplies voltage to a group of lamp filaments 193. The amplitude of the voltage supplied by circuits 109 is controlled responsive to probe 105 so as to maintain a preset, preferably adjustable, operating temperature, typically in the range 850° to 900° C., in chamber 30. As the temperature sensed by probe 105 deviates from the preset value, control circuit 109 changes the voltage supplied to lamp filaments 193 so as to return the sensed temperature to the preset value.

The edge support quartz tubes 64 within the heating chamber 30 for the endless conveyor belt 20 enclose infrared heater coils 69 (FIG. 4) to provide for heating the longitudinal side edge portions of the conveyor belt 20 to thereby provide a constant transverse temperature profile. Since the support quartz tubes 64 tend to wear with use, they are freely held in the semi-circular grooves 39 on the end walls of the heating chamber 30, such that they need be simply rotated after a period of time to present a new wear surface for the conveyor belt 20.

It should now be clearly understood, as seen in FIGS. 4 and 6, that the main purpose of the top and bottom sheet metal covers 45 and 48 provided for the heating chamber 30 is to structurally hold together the sheets of insulation of which its rectangular enclosure is constructed. Furthermore, these top and bottom sheet metal covers 45 and 48 hold the insulating walls of the heating chamber 30 together as an assembled unit such that it need be only supported at its four corners by support lugs 82 attached by bolts 83 to the top longitudinal side members 15a of the lower framework 15, thereby having a minimum contact with the supporting structure while being able to be surrounded by cooling air being drawn past it by the fan 37.

It should now be further understood that the insulating sheets 38, 40, and 43 of which the heating chamber 30 is constructed are made sufficiently thick to keep down the heat transfer from the interior of the heating chamber 30 so that the top and bottom sheet metal covers 45 and 48 are held at a reasonable temperature.

Reference will next be made to FIGS. 3 and 7 which show the baffle unit 84 provided at the entrance end of the heating chamber 30. The baffle unit provided at the exit end of the heating chamber is constructed the same as the one for the entrance end. Each baffle unit 84 includes a sheet metal tunnel housing 86 which encloses a vertically adjustable baffle assembly 87. A sheet metal passageway 98 having double sheet metal walls enclosing sheets 111 of insulation provides for connecting the end of the sheet metal tunnel housing 86 to the end of the heating chamber 30. The adjustable baffle assembly 87 comprises a sheet metal horizontally disposed inner wall 89 having its sides bent upwardly to slide vertically relative to the inner side walls of the tunnel housing 86. The movable inner wall 89 has a plurality of spaced transversely disposed baffle walls 90 welded to depend from the bottom thereof and a series of holes 91 disposed transversely thereon at a point near the outer baffle walls 90. Two insulating sheet members 93 and 94 are supported on the top surface of the movable inner wall 89 and spaced to provide a slit or channel opening 95 above the series of holes 91 thereon.

The movable inner wall 89 is supported at each corner thereof by tie rods 96 which extend up through the top wall of the tunnel housing 86 and are held by nuts 97. It should thus be evident that by loosening or tightening the nuts 97 on each of the corner tie rods 96, the movable inner wall 89 can be raised or lowered so that the lower ends of the depending baffle walls 90 can be adjusted relative to the top surface of the conveyor belt 20. The space between the inner top wall of the tunnel housing 86 and the top of the insulated sheet members 93 and 94 forms a plenum chamber 99 for baffle gas. Such a construction permits the depending baffle walls 90 to be vertically positioned so that their bottom ends just clear workpieces 103 (FIG. 3) being carried on the conveyor belt 20 for processing in the heating chamber 30.

The hollow interior of the sheet metal base 100 for baffle housing 86 is covered with spaced sheet members 101 and 102 of insulation. Disposed in the space between sheet members 101 and 102 is a small sheet metal plenum chamber 104 having a connector 92 in the bottom wall thereof which is connected to a tube 106 supplied with a baffle gas. Located above a slot 114 in the plenum chamber 104 is a member 107 which has a series of holes 108 in the top thereof for introducing the baffle gas. It should be noted that the lower series of holes 108 in member 107 is offset a short distance along the path of the conveyor belt 20 from the upper series of holes 91 on the movable inner wall 89. The three belt support quartz tubes 64 have their terminal ends freely resting on the top of the plenum chamber 104 (FIG. 3) and the terminal wires (not shown) of the infrared heater coils 69 within the edge quartz tubes 64 pass out through holes 108 in member 107.

Mounted about a sheet metal outlet port 116 on the outer end of the metal housing 86 is an exhaust duct 110. A slot 117 in the top of the output port 116 opens to the bottom of the exhaust duct 110. The exhaust duct 110 is a vertically extending rectangular chimney provided with a manually adjustable damper 112. The exhaust duct 110 creates a draft to the outside atmosphere for the hot mixture of cover gas, baffle gas, and any outside air which may enter the tunnel housing 86. The exhaust duct 110 thus helps to prevent outside air from passing into and contaminating the atmosphere within the heating chamber 30. The damper 112 can be manually adjusted to control the amount of hot gas permitted to be withdrawn in this manner.

It should now be clear that the cover gas and baffle gas are provided as indicated by flow meters 113 (FIG. 2) on the end wall of the pedestal 12. The cover gas, which may be nitrogen or oxygen, for example, is fed under a slight pressure by way of tubes 179 to connectors 180 and 181 on a respective plenum chamber 46 and 49 on the top and bottom of heating chamber 30, as illustrated in FIGS. 2, 3, and 4. The cover gas is thus forced to slowly and evenly filter through all portions of the sheets 43 and 38 of porous insulation which form the top and bottom walls of the heating chamber 30. In other words, the insulating sheets 43 and 38 must have sufficient porosity to pass the pressurized cover gas so that it disburses throughout the large area of the internal upper and lower walls of the heating chamber 30 at a low velocity, i.e., so that an even, slow moving blanket of cover gas is introduced into the heating chamber 30 without creating any substantial gas movement therein.

As illustrated in FIGS. 2 and 3, the cover gas is also fed as a baffle gas by way of tubes 106 and connectors 88 and 92 to the respective plenum chamber 99 formed on the upper portion of the tunnel housing 86 and the plenum chamber 104 provided at the bottom of the tunnel housing 86 just below the conveyor belt 20. The baffle gas is thus introduced by way of the series of holes 91 into the area above the conveyor belt 20 and by way of the longitudinally offset series of holes 108 into the area below the conveyor belt 20. Such an introduction of the baffle gas creates a turbulence which effectively purges the open mesh of the conveyor belt 20 of any air or water vapor which may be trapped therein as a result of moving in from the outside atmosphere. It should now be understood that the baffle walls 90 serve to confine the turbulent baffle gas so created to the outer end portion of the tunnel housing 86 and also serve to prevent this turbulence from being felt within or carried into the heating chamber 30.

It should now be especially noted there are no metal construction parts within the heating chamber 30 of the infrared furnace 10 of the present invention, other than the conveyor belt 20 which is continually moving therethrough. Thus, the radiation from the infrared lamp 72, which does not directly strike the workpiece 103 being carried by the conveyor belt 20, upon hitting the white smooth surfaces of the sheets of insulation material forming the internal walls of heating chamber 30, in part reflects back onto workpieces 103. Thus, the smooth white walls of the sheets of insulation effectively serve to increase the direct absorption of the near infrared rays by workpieces 103.

By controlling the operation of the upper and lower series of infrared lamps 72, the temperature of the heating chamber 30 can be incrementally stepped from the ambient room temperature to any desired set operating temperature up to 1000° C. in a matter of minutes. Moreover, the temperature in each of the several longitudinal zones can be rapidly changed without overshoot from one temperature level to another as required for processing workpieces such as integrated circuit chips, thick film circuit boards, and solar cells. It should be understood that the fast, even response of the infrared furnace 10 to its temperature controls is aided by the fact that no cooling is provided for metal walls or reflectors within the heating chamber, such as conventionally provided in infrared furnaces. Such metal parts heat up by absorbing the infrared radiation and, despite the cooling, create hot spots within the heating chamber which foul up the temperature profile.

It should now be clear that the sheets 38 and 40 of insulation which form the inner walls of the heating chamber 30 serve to contain the heat supplied by the infrared lamps 72, to introduce cover gas at a low static pressure into the heating chamber 30, to reflect the radiation from the infrared lamps 72 back to workpieces 103 being processed, and to radiate far infrared radiation from their walls to workpieces 103.

The controlled atmosphere capability provided by the introduction of a cover gas such as nitrogen for example, into the heating chamber 30 is highly useful in that it keeps out unwanted gases such as the oxygen and thereby permits high temperature operation without, for example, the oxidation problems associated with metal alloys.

Figure 15:
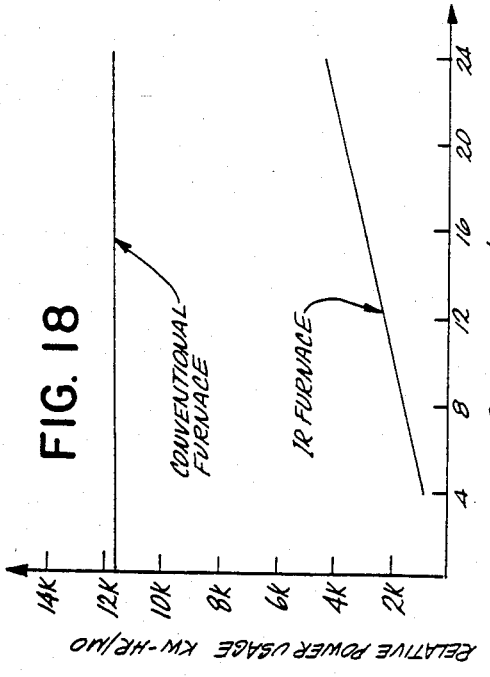
FIG. 15 is a graph comparing the processing time in an IR furnace as utilized in practicing the invention with a conventional furnace.

The described furnace is referred to herein as an IR furnace because it has a heating zone in which workpieces are exposed to direct near infrared radiation from a source at a temperature substantially higher than the heating zone. Heating chamber 30 forms the heating zone through which workpieces 103 are transported on conveyor belt 20. Lamps 72 function as a source of near infrared radiation with energy concentration a wavelength band of approximately 0.7 to 2.5 microns. Lamps 72, being arranged in side-by-side relationship along the entire length of conveyor belt 20 within chamber 30 above and below the conveyor belt path, directly radiate near infrared energy into workpieces 103, thereby transferring heat thereto. In addition, lamps 72 radiate near infrared energy to the walls of chamber 30, i.e., sheets 38 and 40 to transfer heat thereto. The walls of heating chamber 30 in turn, radiate far infrared energy concentrated in a higher wavelength band, i.e., approximately 2.5 to 20 microns to the workpieces. Thus, there are two components of heat transfer to the workpieces, direct radiation from the infrared source and indirect radiation via the walls of heating chamber 30. The indirect heat transfer component to each workpiece is represented by the expression $$q_1 = \epsilon A \sigma [T_B^4 - T_W^4] \tag{1}$$

where $q_1$ is the heat transfer to the workpiece $\epsilon$ is the emissivity, A is the heat transfer surface area, $\sigma$ is the Stefan-Boltzmann constant, $T_B$ is the bulk temperature in degrees Kelvin of the walls of chamber 30, which is the operating temperature of the furnace when in operation, and $T_W$ is the temperature in degrees Kelvin of the workpiece. The direct heat transfer component to each workpiece is represented by the expression $$q_2 = \epsilon A \sigma [T_F^4 - T_W^4], \tag{2}$$

where $q_2$ is the direct heat transfer to the workpiece, $T_F$ is the filament temperature of the source in degrees Kelvin and $\epsilon$, A, $\sigma$, and $T_W$ are as defined above. The total heat transfer to the workpiece is represented by the expression $$Q = q_1 + q_2, \tag{3}$$

where Q is the total heat transfer. The thermal mass of the radiating source, i.e., the lamp filaments, is substantially smaller than the thermal mass of material heated thereby, namely the walls of chamber 30, conveyor 20, and the workpieces. As a result, the bulk temperature, $T_B$, in the heating zone, i.e., the temperature of the surfaces within the heating chamber 30 including its walls, remains much lower than the filament temperature, $T_F$, of the near infrared radiation source. Typically, $T_F$ is of the order of 1400° to 2000° K. and $T_B$ is of the order of 1120° to 1170° K. When a workpiece first enters the heating zone, its temperature is substantially lower than both the bulk temperature and the filament temperature, so that substantial heat transfer takes place by both direct and indirect radiation. As the temperature of the workpiece rises and approaches the bulk temperature, the heat transfer by indirect radiation drops off asymptotically, but the heat transfer by direct radiation continues at a high rate. This leads to a substantially faster firing interval, i.e., processing time than in a conventional furnace where the workpieces are only heated by indirect radiation. FIG. 15 depicts for a conventional furnace and an IR furnace a typical temperature of a workpiece as a function of time and the length of the firing interval required to process the workpiece. As illustrated, the processing time can be reduced by as much as threefold or more in an infrared IR furnace, depending upon the circumstances. As a result, the length of the conveyor belt and thus the furnace as a whole, can be substantially reduced.

Figure 18:
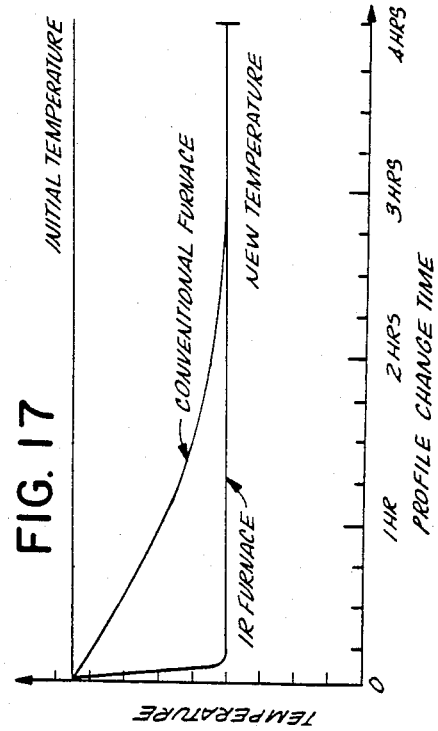
FIG. 18 is a graph comparing relative power usage of an IR furnace as utilized in practicing the invention with a conventional furnace.
Figure 16:
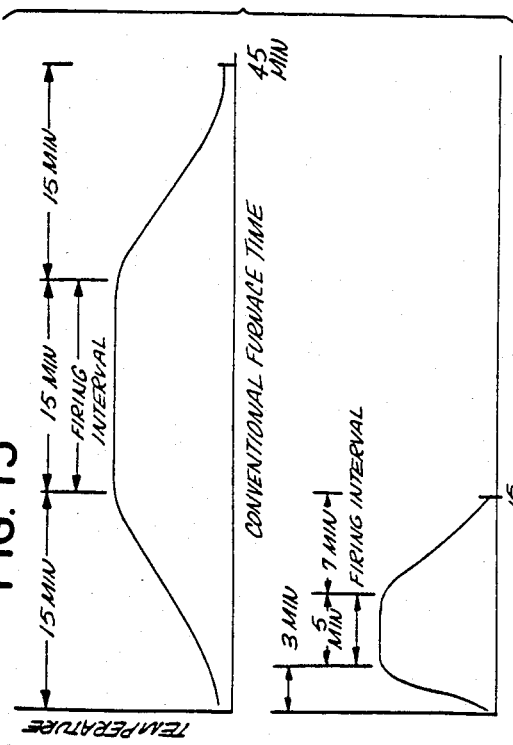
FIG. 16 is a graph comparing the startup time of an IR furnace as utilized in practicing the invention with a conventional furnace.
Figure 17:
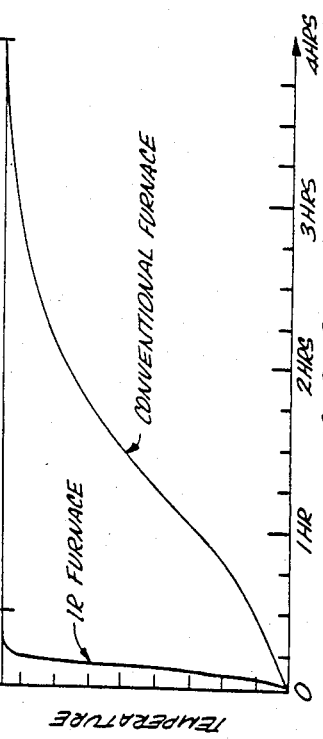
FIG. 17 is a graph comparing the temperature profile change time of an IR furnace as utilized in practicing the invention with a conventional furnace.

Similarly, the use of direct near infrared radiation from a source at a substantially higher temperature than the bulk temperature, markedly accelerates the heating of the walls of the heating chamber. Less insulation is also required in an IR furnace because of the large direct radiation component and the high filament temperature of the near infrared source. Consequently, an IR furnace can have a smaller thermal mass than a conventional furnace, without excessive heat loss. These factors permit the bulk temperature of the IR furnace to be changed more rapidly than a conventional furnace. FIG. 16 depicts for a conventional furnace and an IR furnace, a typical startup time, illustrating that the IR furnace rapidly rises to its operating temperature, while the conventional furnace rises asymptotically to its operating temperature. FIG. 17 depicts for a conventional furnace and an IR furnace, the profile of the change time, showing how an IR furnace changes rapidly from an initial temperature to a new temperature, while a conventional furnace approaches the new temperature asymptotically. FIG. 18 depicts for an IR furnace and a conventional furnace, typical relative power usage, showing the power usage as a function of the operating hours of the furnace per day. Since the conventional furnace is continuously heated 24 hours a day, regardless of the number of operating hours, its power usage is constant, while the power usage of an IR furnace increases linearly as a function of the operating hours per day because the IR furnace is turned off when not in use. It should be noted that even when an IR furnace is operated 24 hours a day, it uses substantially less power than a conventional furnace because of the power transfer efficiency of the direct radiation component and the smaller permissible thermal mass.

While the invention has been concerned with a particular embodiment of the present invention, it is to be understood that many modifications and variations in the construction and arrangement thereof may be provided for without departing from the spirit and scope of the invention or sacrificing any of its advantages. The invention, is, therefore, considered as including all such possible modifications and variations coming within the legitimate and valid scope of the appended claims.

What is claimed is:

1. An infrared furnace comprising:

an elongated rectangularly shaped heating chamber having its interior top, bottom, side, and end walls formed of sheets of porous insulation;

a sheet metal housing enclosing the insulating walls of said heating chamber;

a conveyor belt passing into and out of the heating chamber through openings provided in the end walls thereof;

a first series of infrared heating elements in said heating chamber transversely disposed above said conveyor belt with their terminal ends extended through the side walls thereof;

a second series of infrared heating elements in said heating chamber transversely disposed below said conveyor belt with their terminal ends extending through the side walls thereof;

an upper plenum chamber formed between the top insulating wall of said heating chamber and the top wall of said sheet metal housing;

a lower plenum chamber formed between the bottom insulating wall of said heating chamber and the bottom wall of said sheet metal housing; and means for introducing a pressurized cover gas into the upper and lower plenum chambers which filters through the porous upper and lower insulating walls of said heating chamber into the interior thereof.

2. An infrared furnace comprising:

an elongated rectangularly shaped heating chamber having its interior top, bottom, side, and end walls formed of sheets of insulation;

a sheet metal housing enclosing the insulating walls of said heating chamber;

a conveyor belt passing into and out of the heating chamber through openings provided in the end walls thereof;

a first series of infrared heating elements in said heating chamber transversely disposed above said conveyor belt with their terminal ends extended through the side walls thereof;

a second series of infrared heating elements in said heating chamber transversely disposed below said conveyor belt with their terminal ends extending through the side walls thereof; and elongated quartz rods extending lengthwise through said heating chamber on which said conveyor belt rides.

3. An infrared furnace as defined in claim 2 wherein heater coils are provided within the elongated quartz rods on which the side edges of said conveyor belt ride.

4. An infrared furnace comprising:

a housing having insulated walls defining an elongated tunnel disposed on a longitudinal axis between an entrance and an exit;

a conveyor continuously moving through the tunnel along the longitudinal axis between the entrance and the exit;

a plurality of parallel spaced apart rods;

means for holding the rods to extend through the tunnel parallel to its longitudinal axis directly under the conveyor to support the conveyor such that the rods are free to rotate; and means in the tunnel for radiating infrared energy onto the conveyor.

5. The furnace of claim 4, comprising heating means disposed in at least one of the rods.

6. The furnace of claim 4, in which two of the rods lie near the respective sides of the housing, the furnace additionally comprising heating means disposed in the two rods to compensate for heat loss through the sides of the housing.

7. The furnace of claim 4, in which the rods are made of quartz.

8. An infrared furnace comprising:
a housing having walls defining an elongated tunnel disposed between an entrance and an exit, the walls each comprising a porous insulative inner panel opening into the tunnel and a non-porous outer panel;
a conveyor moving through the tunnel between the entrance and the exit;
means for supplying gas under pressure between the inner and outer panels to induce flow through the inner panel to the tunnel; and
means in the tunnel for radiating infrared energy onto the conveyor.

9. The furnace of claim 8, additionally comprising a first baffle unit having a chamber connecting the entrance of the tunnel to the exterior of the furnace and a second baffle unit having a chamber connecting the exit of the tunnel to the exterior of the furnace such that the conveyor passes through the chambers, the first and second baffle units including means for injecting gas onto the conveyor in the chambers.

10. The furnace of claim 9, in which the first and second baffle units additionally include means for removing gas from the chambers.

11. The furnace of claim 8, in which the radiating means comprises a plurality of infrared energy sources distributed on both sides of the conveyor in direct communication therewith.

12. The furnace of claim 8 additionally comprising means for sensing the temperature in at least one zone of the tunnel and means responsive to the temperature sensing means for controlling the infrared energy radiated onto the conveyor so as to maintain the temperature in the zone constant.

13. The furnace of claim 8, in which the means for radiating infrared energy comprises a plurality of elongated, tubular infrared heating elements disposed in the tunnel in direct communication with the conveyor, means for applying electrical energy to the heating elements to energize them, means for sensing the temperature in at least one zone of the tunnel, and means responsive to the temperature sensing means for controlling the voltage of the electrical energy applied to the heating elements to maintain the temperature in the zone constant.

14. The furnace of claim 13 in which the sensing means maintains the temperature in the zone constant at a temperature between 1120° to 1170° K.

15. The apparatus of claim 13 in which the controlling means controls the voltage applied to the heating elements to maintain their temperature of the order of 1400° to 2000° K.

16. The furnace of claim 13, additionally comprising one or more rods extending through the tunnel parallel to its longitudinal axis directly under the conveyor to support the conveyor.

17. The furnace of claim 13, in which the sources are tungsten filaments enclosed in a sealed quartz envelope with an inert gas.

18. The furnace of claim 17, in which the temperature of the infrared sources is of the order of 1400° K. to 2000° K.

19. The furnace of claim 18, in which the temperature in the interior of the tunnel is of the order of 1120° K. to 1170° K.

20. The furnace of claim 13, additionally comprising a plurality of parallel spaced apart rods extending through the tunnel parallel to its longitudinal axis directly under the conveyor to support the conveyor.

21. The furnace of claim 20, comprising heating means disposed in at least one of the rods.

22. The furnace of claim 20, in which two of the rods lie near the respective side walls of the housing, the furnace additionally comprising heating means disposed in the two rods to compensate for heat loss through the side walls of the housing.

23. The furnace of claim 13, in which the walls defining the tunnel comprise approximately horizontal top and bottom walls and approximately vertical side walls together forming a rectangular cross section and the heating elements are parallel to the top and bottom walls and perpendicular to the side walls.

24. The furnace of claim 23, in which the ends of the heating elements are supported by the side walls.

25. The furnace of claim 23, in which the ends of the heating elements pass through the side walls to the exterior of the housing, the furnace additionally comprising an outer enclosure surrounding the top, bottom, and side walls in spaced relationship from the side walls;
means for applying electrical energy to the ends of the heating elements to energize them; and
means for blowing air between the enclosure and the side walls to cool the ends of the heating elements.

26. The furnace of claim 13, additionally comprising a first baffle unit having a chamber connecting the entrance of the tunnel to the exterior of the furnace and a second baffle unit having a chamber connecting the exit of the tunnel to the exterior of the furnace such that the conveyor passes through the chambers, the first and second baffle units including means for injecting gas onto the conveyor in the chambers.

27. The furnace of claim 26, in which the first and second baffle units additionally include means for removing gas from the chambers.

28. The furnace of claim 27, in which each removing means comprises an upwardly extending duct opening into the chamber between the point of injection of gas and the exterior of the furnace.

29. The furnace of claim 28, in which the first and second baffle units additionally comprise means for creating turbulence in the injected gas.

30. The furnace of claim 29, in which the first and second baffle units each additionally comprise a plurality of baffle walls between the point of injection of gas and the tunnel.

31. The apparatus of claim 13, in which the controlling means controls the voltage of the energy applied to the heating elements so the heating elements radiate infrared radiation with energy concentration in a wavelength band of approximately 0.7 to 2.5 microns.

32. An infrared furnace comprising:
an elongated rectangularly shaped heating chamber having its interior top, bottom, side, and end walls formed of sheets of insulation in the form of compressed, white alumina fiber;
a sheet metal housing enclosing the insulating walls of said heating chamber;
a conveyor belt passing into and out of the heating chamber through openings provided in the end walls thereof;
a first series of infrared heating elements in said heating chamber transversely disposed above said conveyor belt with their terminal ends extended through the walls thereof; and a second series of infrared heating elements in said heating chamber transversely disposed below said conveyor belt with their terminal ends extending through the side walls thereof.

33. An infrared furnace as defined in claim 32 wherein the sheets of insulation forming the interior walls of said heating chamber have a rating of 3000° F.

34. An infrared furnace as defined in claim 32 wherein the top and bottom walls of said heating chamber are formed of two sheets of insulation and wherein the side walls thereof are formed of a single sheet of insulation.

35. An infrared furnace as defined in claim 32 wherein said sheet metal housing includes:

side walls and end walls covering the corresponding insulating walls of said heating chamber;

a top cover which fits over the top portion of said heating chamber;

a bottom cover which fits over the bottom portion of said heating chamber; and means for connecting said top and bottom covers to said side walls and end walls.

36. An infrared furnace as defined in claim 32 including:

outwardly extending tray members attached to the sides of said sheet metal housing; and ceramic connectors mounted on the outer ends of said tray members to which the terminal leads of said infrared heating elements are connected.

37. An infrared furnace as defined in claim 32 including baffle means at the entrance and exit ends of said heating chamber.

38. An infrared furnace as defined in claim 37 wherein each of said baffle means includes:

a baffle housing through which said conveyor belt passes; and a vertically disposed exhaust duct on the outer end of said baffle housing.

39. An infrared furnace as defined in claim 38 wherein said baffle housing includes:

an upper plenum chamber and a lower plenum chamber;

said upper and lower plenum chambers having apertures respectively disposed above and below said conveyor belt; and means for introducing a pressurized baffle gas into each said upper and lower plenum chambers.

40. An infrared furnace as defined in claim 39 wherein said upper plenum chamber has a plurality of transversely disposed vertical baffle walls depending from the bottom thereof.

41. An infrared furnace as defined in claim 40 wherein the bottom wall of said upper plenum chamber is vertically adjustable to vary the depth to which the baffle walls depending therefrom extend into the baffle housing above said conveyor belt.

42. An infrared furnace as defined in claim 32 including a rectangular framework having longitudinal extending side members;

said heating chamber positioned within said rectangular framework and supported on the side members thereof by bracket means attached to the corners of said sheet metal housing.

43. The furnace of claim 32, additionally comprising means for introducing a pressurized cover gas between the sheet metal housing and the insulating walls which filters through the sheets of insulation into the heating chamber.

44. The furnace of claim 43, in which the cover gas is inert.

45. The furnace of claim 44, in which the cover gas is nitrogen.

* * * * *